(12) United States Patent
Cho et al.

(10) Patent No.: US 8,129,710 B2
(45) Date of Patent: Mar. 6, 2012

(54) PLASMON ENHANCED NANOWIRE LIGHT EMITTING DIODE

(76) Inventors: Hans Cho, Palo Alto, CA (US); David Fattal, Mountain View, CA (US); Nathaniel Quitoriano, Pacifica, CA (US)

( * ) Notice: Subject to any disclaimer, the term of this patent is extended or adjusted under 35 U.S.C. 154(b) by 777 days.

(21) Appl. No.: 12/262,451

(22) Filed: Oct. 31, 2008

(65) Prior Publication Data
US 2009/0267049 A1    Oct. 29, 2009

Related U.S. Application Data

(60) Provisional application No. 61/047,668, filed on Apr. 24, 2008.

(51) Int. Cl.
*H01L 33/00* (2010.01)
(52) U.S. Cl. ............ 257/13; 257/10; 257/11; 257/12; 257/14; 257/15; 257/E33.005
(58) Field of Classification Search .............. 257/10–15, 257/E33.005
See application file for complete search history.

(56) References Cited

U.S. PATENT DOCUMENTS

| | | |
|---|---|---|
| 2006/0177660 A1 | 8/2006 | Kumar et al. |
| 2006/0289761 A1 | 12/2006 | Nabet et al. |
| 2007/0111493 A1 | 5/2007 | Lee et al. |
| 2007/0292080 A1 | 12/2007 | Hyde et al. |

OTHER PUBLICATIONS

Taco D. Viser, "Surface plasmons at work?," Nature Physics, vol. 21, Aug. 2006, pp. 509-510.

*Primary Examiner* — Cuong Q Nguyen
*Assistant Examiner* — Tran Tran

(57) ABSTRACT

A nanowire light emitting diode (LED) and method of emitting light employ a plasmonic mode. The nanowire LED includes a nanowire having a semiconductor junction, a shell layer coaxially surrounding the nanowire, and an insulating layer, which is plasmonically thin, isolating the shell layer from the nanowire. The shell layer supports a surface plasmon that couples to the semiconductor junction by an evanescent field. Light is generated in a vicinity of the semiconductor junction and the surface plasmon is coupled to the semiconductor junction during light generation. The coupling enhances one or both of an efficiency of light emission and a light emission rate of the LED. A method of making the nanowire LED includes forming the nanowire, providing the insulating layer on the surface of the nanowire, and forming the shell layer on the insulating layer in the vicinity of the semiconductor junction.

20 Claims, 4 Drawing Sheets

PLASMON ENHANCED NANOWIRE LIGHT EMITTING DIODE

CROSS-REFERENCE TO RELATED APPLICATIONS

The present application claims priority from provisional application Ser. No. 61/047668, filed Apr. 24, 2008, the contents of which are incorporated herein by reference in their entirety.

STATEMENT REGARDING FEDERALLY SPONSORED RESEARCH OR DEVELOPMENT

N/A

BACKGROUND

1. Technical Field

The invention relates to light emitting diodes. In particular, the invention relates to light emitting diodes fabricated from nanostructures.

2. Description of Related Art

Semiconductor devices that generate or emit light are used in and often as a backbone of many modern optoelectronic or photonic systems. In particular, most modern optical communication systems depend on light emitting semiconductor devices for one or more of signal generation, signal regeneration/amplification, and signal modulation (i.e., direct modulation). Light emitting semiconductor devices are devices that generate light through carrier or exciton recombination in a vicinity of a semiconductor junction. Examples of light emitting semiconductor devices include, but are not limited to a light emitting diode (LED) and a semiconductor diode-based laser (i.e., solid-state laser).

In recent years, light emitting semiconductor devices of very small size comprising one or more nanowires have been developed. In particular, semiconductor nanowires that incorporate an integral semiconductor junction have been demonstrated and employed to realize nanowire-based LEDs and semiconductor lasers. Such light emitting semiconductor devices that employ a semiconductor nanowire, either singly or in a plurality, may be attractive for use in a wide variety of applications. In particular, nanowire light emitting semiconductor devices provide additional degrees of freedom in manipulating performance characteristics of such devices that may not be available in conventional devices based solely on bulk semiconductor properties.

Among key limiting performance characteristics of such light emitting semiconductor devices that employ exciton recombination are light emission efficiency and rate of light emission (e.g., switching speed). Light emission efficiency relates to how many of an available number of excitons or exciton pairs in the semiconductor junction actually produce useful emitted light. Related to light emission efficiency is optical output power which may include a measure of how much of the light that is produced is actually emitted in a useful direction. The rate of light emission or electro-optical response time is a measure of how fast the semiconductor device can respond to a change in a voltage bias, for example. The light emission rate is closely related to a recombination rate of the semiconductor junction which, in turn, is related to a probability that a hole/electron pair (i.e., an exciton) will recombine within the semiconductor junction. The light emission rate may limit a modulation rate of a light emitting semiconductor device, for example.

Efforts to overcome limitations associated with light emission efficiency and light emission rate have generally focused on modifying inherent properties of a semiconductor material or materials used to construct the light emitting semiconductor devices. Examples of such effort include attempts to remove or strictly control crystal defects within a crystal lattice of the semiconductor material and various methods related to increasing an optical field intensity within the semiconductor junction. Inclusion of a quantum well within the semiconductor junction (e.g., quantum dots in a nanowire semiconductor junction) has proved useful in increasing the light emission rate. However, there is still a keen interest in developing means for further enhancing one or both of the light emission efficiency and light emission rate of light emitting semiconductor devices. Providing such means would satisfy a long felt need.

BRIEF SUMMARY

In some embodiments of the present invention, a nanowire light emitting diode is provided. The nanowire light emitting diode comprises a nanowire comprising a semiconductor junction. The nanowire light emitting diode further comprises a shell layer that supports a surface plasmon. The shell layer is coaxially disposed around the nanowire adjacent to the semiconductor junction. The nanowire light emitting diode further comprises a plasmonically thin insulating layer disposed between the shell layer and the nanowire. The plasmonically thin insulating layer both electrically isolating the shell layer from the nanowire and permitting evanescent field coupling between the surface plasmon and an active region of the semiconductor junction. One or both of a light emission efficiency and a rate of light emission of the light emitting diode are enhanced.

In other embodiments of the present invention, a method of emitting light is provided. The method of emitting light comprises generating light in a vicinity of a semiconductor junction of a nanowire. The method of emitting light further comprises coupling a surface plasmon to the semiconductor junction during generating light. The surface plasmon is from a shell layer surrounding the semiconductor junction of the nanowire. The surface plasmon is coupled through an insulating layer separating the nanowire and the shell layer.

In other embodiments of the present invention, a method of making a nanowire light emitting diode (LED) is provided. The method of making a nanowire LED comprises forming a nanowire having a semiconductor junction between a first end and a second end of the nanowire. The method of making a nanowire LED further comprises providing an insulator layer on a surface of the nanowire. The insulator layer circumferentially covers the nanowire surface in a vicinity of the semiconductor junction. The insulator layer is plasmonically thin. The method of making a nanowire LED further comprises forming a shell layer adjacent to a surface of the insulator layer in the vicinity of the semiconductor junction. The shell layer supports a surface plasmon. The insulator layer electrically isolates the nanowire from the shell layer while allowing passage of an evanescent field that couples the surface plasmon on the shell layer to an active region of the semiconductor junction.

Certain embodiments of the present invention have other features that are one or both of in addition to and in lieu of the features described hereinabove. These and other features of the invention are detailed below with reference to the following drawings.

BRIEF DESCRIPTION OF THE DRAWINGS

The various features of embodiments of the present invention may be more readily understood with reference to the following detailed description taken in conjunction with the accompanying drawings, where like reference numerals designate like structural elements, and in which.

DETAILED DESCRIPTION

Figure 1A:
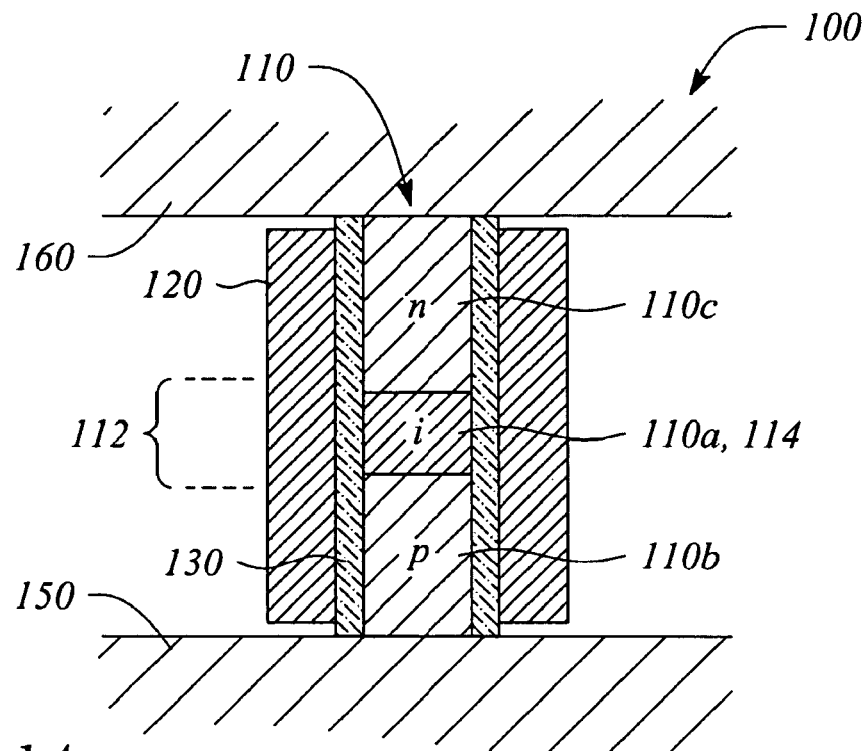
FIG. 1A illustrates a cross sectional view of a nanowire light emitting diode, according to an embodiment of the present invention.

Embodiments of the present invention provide a nanowire light emitting diode (LED) with plasmonic enhancement. The plasmonic enhancement comprises plasmonic stimulation of exciton recombination through close coupling between an active region of the nanowire LED and a surface plasmon supporting layer or film. In particular, according to the embodiments of the present invention, a shell layer surrounding the nanowire comprises a material that supports surface plasmons in one or more plasmonic modes. The shell layer is coupled to the active region of a nanowire LED. The coupling between the surface plasmon and exciton recombination within the active region facilitates an increased recombination rate relative to a recombination rate without the coupling, for example. In some embodiments, the plasmonic enhancement may enhance one or both of a light emission efficiency and an effective rate of light emission or electro-optical response speed of the nanowire LED.

In particular, the presence of a surface plasmon on the shell surrounding the nanowire semiconductor junction may accelerate radiative recombination of excitons (e.g., of hole-electron pairs) and further may absorb and essentially carry away much of the radiative energy emitted by the exciton pair recombination. To understand the coupling interaction, consider an electron-hole pair that is just starting to recombine. As the pair begins to recombine, it starts sending out 'waves' of radiation. In free space (e.g., in the absence of the shell layer), these waves propagate away from the active region as light. The propagating waves continue until the pair is fully recombined. A unit of propagating energy is known as a photon and one photon is typically created once an exciton pair has fully recombined.

However, in the presence of nearby 'objects' such as the shell layer, these waves can be reflected back toward the active region and can, in some instances, interact with the very exciton pair that created the waves in the first place. The back-reflected waves can either stimulate or inhibit further emission of radiation by the exciton pair. When the nearby objects are made of a material that supports a surface plasmon, the interaction during recombination may be enhanced.

For example, the plasmon supporting material of the shell layer may be considered as a 'reservoir' of free electrons. When the waves of radiative energy first reach the plasmon supporting material of the shell layer, the waves cause electrons of the reservoir to vibrate. Under certain conditions, such as when a frequency of the waves arriving from the recombining exciton pair matches a plasmonic frequency of the plasmon supporting material, electron vibration induced by the waves may be relatively significant. The vibrating electrons create a changing electric field in a vicinity of the shell layer. The changing electric field (i.e., the surface plasmon) creates an evanescent field that, in turn, extends back into the active region of the semiconductor junction. The evanescent field effectively influences and may alter further radiative emission from or by the recombining exciton pair. In many instances, the influence may be considerably more pronounced than that resulting from a wave reflected by non-plasmonic supporting objects nearby. In addition, the intermixing of the stimulating electromagnetic waves and electron motion in the surface plasmon supporting material is called a surface plasmon polariton (SPP). The SPP propagates along the nanowire/shell layer interface until an end is reached. At the end, the SPP, or more generally the propagating surface plasmon, is converted to 'pure' electromagnetic radiation and emitted as light.

Various embodiments of a nanowire light emitting diode (LED) of the present invention comprise a nanowire having a semiconductor junction. The semiconductor junction emits light when pairs of excitons (e.g., holes and electrons or carriers) recombine in an active region of the semiconductor junction to produce photons. The semiconductor junction may comprise one of a p-n diode junction and a p-i-n diode junction, for example. The semiconductor junction may further comprise heterojunction comprising plurality of different semiconductor materials arranged in layers.

In the various embodiments, the nanowire LED further comprises a shell layer coaxially disposed around and electrically isolated (i.e., insulated) from the nanowire. The shell layer comprises a surface plasmon supporting material. For example, the shell layer may comprise a metal such as, but not limited to, a noble metal (e.g., gold, silver, copper, etc.). Light emitting recombination within the active region is coupled to a surface plasmon on a surface of the shell layer. The coupling may be facilitated by controlling a distance separating the shell layer from the active region, for example.

In some embodiments, the active region of the nanowire LED comprises a quantum dot (e.g., an intrinsically doped quantum dot or dots). The quantum dot may further enhance light emission by the nanowire LED. For example, by adjusting a size of the quantum dot, a frequency of light emitted by the nanowire LED may be adjusted or tuned. In particular, the emission frequency may be tuned to correspond to a plasmonic mode of the nanowire LED, according to some embodiments of the present invention.

In various embodiments, the quantum dot may comprise a segment or portion of the nanowire. In particular, the segment that provides the quantum dot is formed to be short enough to effectively confine excitons. In some such embodiments, the quantum dot may be formed within a heterojunction of the nanowire LED wherein the heterojunction comprises two or more semiconductor materials with differing bandgaps. As such, the quantum dot may effectively act as a quantum well within the nanowire.

The term 'nanowire' as employed herein is defined as an individual quasi-one dimensional, nano-scale, often single crystalline structure typically characterized as having two spatial dimensions or directions that are much less than a third spatial dimension or direction. The presence of the third, greater dimension in nanowires facilitates electron transport along that dimension while conduction is limited in the other two spatial dimensions. Moreover, a nanowire, as defined herein, generally has an axial dimension or length (as a major or third spatial dimension), opposite ends and a solid core. For example, the axial length of a nanowire is typically many times that of a diameter, or equivalently of a width, of the nanowire. A nanowire also may be referred to as a nanowhisker, nanorod or a nanoneedle. A 'semiconductor nanowire' is a nanowire comprising a semiconductor material.

Nanowires may be formed according to a variety of methodologies. For example, nanowires may be formed by filling a mold comprising nano-scale holes with a material of the nanowires. In particular, a mold or mask having holes is formed on a surface. The holes are then filled with a material that will become the nanowire. In some cases, the mold is removed to leave free-standing nanowires. In other instances, the mold (e.g., $SiO_2$) may remain. The composition of the material filling the holes may be varied along the length of the nanowire to form a heterostructure and/or a dopant material may be varied along the length to form a semiconductor junction (e.g., a p-n junction). In another example, nanowires are grown by self-assembly without a mold.

Nanowires may be grown using a variety of techniques. For example, catalyzed growth includes, but is not limited to, metal-catalyzed growth using one or more of a vapor-liquid-solid (VLS) technique and a vapor-solid (VS) technique, for example. A nanoparticle catalyst is formed on a surface from which the nanowire is to be grown. The growth may be performed in a chemical vapor deposition (CVD) chamber, for example, using a gas mixture comprising precursor nanowire materials and the assistance of the nanoparticle catalyst.

In particular, the nanoparticle catalyst accelerates decomposition of the precursor nanowire material in the gas mixture. Atoms resulting from decomposition of a particular nanowire material-containing gas diffuse through or around the nanoparticle catalyst and precipitate on the underlying substrate. The atoms of the nanowire material precipitate between the nanoparticle catalyst and the surface to initiate nanowire growth. Moreover, catalyzed growth of the nanowire is continued with continued precipitation at the nanoparticle-nanowire interface. Such continued precipitation causes the nanoparticle to remain at the tip of the free end of the growing nanowire. The nanowire growth is continued until a targeted nanowire length is achieved. Other techniques, such as laser ablation for example, also may be used to supply the material forming the growing nanowire. The composition of the material forming the nanowire may be varied along the length of the nanowire to form an axial heterostructure or it may be varied in the radial direction to form a radial or "core-shell" heterostructure. The dopant concentration may be varied in magnitude or type to form an electrical junction (e.g., a p-n junction).

During catalytic growth, nanowires may grow from the location of the nanoparticle catalyst in a predominately perpendicular direction to a plane of a suitably oriented substrate surface. Under the most common growth conditions, nanowires grow in <111> directions with respect to a crystal lattice and therefore, grow predominately perpendicular to a (111) surface (of a crystal lattice). For (111)-oriented horizontal surfaces, a nanowire will grow predominately vertically relative to the horizontal surface. On (111)-oriented vertical surfaces, a nanowire will grow predominately laterally (i.e., horizontally) relative to the vertical surface.

The use of brackets '[ ]' herein in conjunction with such numbers as '111' and '110' pertains to a direction or orientation of a crystal lattice and is intended to include directions '< >' within its scope, for simplicity herein. The use of parenthesis '( )' herein with respect to such numbers as '111' and '110' pertains to a plane or a planar surface of a crystal lattice and is intended to include planes '{ }' within its scope for simplicity herein. Such uses are intended to follow common crystallographic nomenclature known in the art.

The terms 'semiconductor' and 'semiconductor materials' as used herein independently include, but are not limited to, group IV, group III-V and group II-VI semiconductor materials, including compound semiconductor materials, from the Periodic Table of the Elements, or another semiconductor material that forms any crystal orientation. For example, and not by way of limitation, a semiconductor substrate may be a silicon-on-insulator (SOI) wafer with a (111)-oriented or a (110)-oriented silicon layer (i.e., top layer), or a single, free-standing wafer of (111) silicon, depending on the embodiment. The semiconductor materials, whether part of a substrate or a nanowire, that are rendered electrically conductive, according to some embodiments herein, are doped with a dopant material to impart a targeted amount of electrical conductivity (and possibly other characteristics) depending on the application.

An insulator or an insulator material useful for the various embodiments of the invention is any material that is capable of being made insulating including, but not limited to, a semiconductor material from the groups listed above, another semiconductor material, and an inherently insulating material. Moreover, the insulator material may be an oxide, a carbide, a nitride or an oxynitride of any of the above-referenced semiconductor materials such that insulating properties of the material are facilitated. For example, the insulator may be a silicon oxide ($SiO_x$). Alternatively, the insulator may comprise an oxide, a carbide, a nitride or an oxynitride of a metal (e.g., aluminum oxide) or even a combination of multiple, different materials to form a single insulating material or it may be formed from multiple layers of insulating materials.

A 'semiconductor junction' as used herein refers to a junction formed within a semiconductor material between two differently doped regions thereof. For example, a junction between a p-doped region and an n-doped region of the semiconductor material is referred to as a p-n semiconductor junction or simply a p-n junction. The p-n junction includes asymmetrically doped semiconductor junctions such as, but not limited to, $p^+$-n junctions where '$p^+$' denotes a relatively higher concentration of the p-type dopant or impurity compared to the n-type dopant or impurity. A semiconductor junction in which an intrinsically doped region (i-region) lies between and separates the p-doped region (or 'p-region') and the n-doped region (or 'n-region') is generally referred to herein as a p-i-n semiconductor junction or simply a p-i-n junction. The term 'semiconductor junction' as used herein also refers to complex junctions that may include one or more of layers of different semiconductor materials (e.g., GaAs and GaAlAs), layers of different doping concentrations (e.g., p, $p^+$, $p^-$, $p^{++}$, n, $n^+$, $n^-$, $n^{++}$, i, etc.), and doping concentration gradients within and across layers. Further herein, an 'intrinsically' doped semiconductor or a related 'intrinsic' region/layer/semiconductor is defined as a semiconductor or semiconductor region having a doping concentration that is either essentially undoped (e.g., not intentionally doped) or relatively lightly doped when compared to doping concentrations present in other layers or regions of the semiconductor junction (e.g., p-doped regions or n-doped regions).

As used herein, the 'active region' of the semiconductor junction is defined as that portion of the junction that actively participates in the intended operation of the semiconductor junction. For example, the active region of a semiconductor junction in an optical emitter is that portion of the junction that generates a majority of the photons produced by the optical emitter. In some embodiments, the 'active region' is defined as comprising the sum of a depletion region thickness plus a distance equal to a few minority carrier diffusion lengths away from or around the semiconductor junction into the surrounding neutral regions. In a p-i-n diode junction, the active region may be essentially confined to an intrinsic region (i.e., i-region) of the diode junction, for example.

Semiconductor junctions that join different semiconductor materials are defined and referred to herein as either 'heterostructure junctions' or simply 'heterojunctions'. For example, a layer of a first semiconductor material sandwiched between two adjacent layers of a second semiconductor material would be referred to as a heterojunction. Such a heterojunction, wherein the first semiconductor material has a first bandgap and the second semiconductor material has a second band gap, the first bandgap being lower than the second bandgap, is defined herein as a quantum well or a heterojunction quantum well.

Herein, no distinction is made between various specific types of junctions (e.g., p-n, p-i-n, $p^+$-n, $p^{+-}$n, heterojunction, etc.) unless such distinction is necessary for proper understanding. Semiconductor junctions between an n-type semiconductor and a p-type semiconductor (of the same or of a different material) are also often referred to as 'diode junctions' whether or not an intrinsic layer separates the n-type doped and p-type doped semiconductors. Such diode junctions are the basis for the various nanowire LED device embodiments described herein.

As used herein, the term 'quantum dot' is defined and employed to mean a semiconductor structure that confines an exciton (i.e., carriers such as a hole and/or an electron) in three spatial dimensions (3D). For example, a nanodisc or nanodot of a semiconductor material may be a quantum dot. The 3D spatial confinement distinguishes the quantum dot from the nanowire described above, which provides only two dimensional (2D) spatial confinement of excitons therewithin. In general, an extent of the confinement in any of the three spatial dimensions need not be absolute for the quantum dot. For example, a structure that provides only partial exciton confinement in a first dimension but total or absolute confinement in two other dimensions is still considered a quantum dot herein.

While a nanowire is not generally a quantum dot, a nanowire may comprise a quantum dot. For example, a nanowire may comprise a first segment sandwiched between and separating a second segment and a third segment such that the segments in combination form the nanowire. If the first segment confines or partially confines excitons along an axial direction within the nanowire, then the first segment may effectively act as a quantum dot. In particular, since the nanowire, by virtue of its cross sectional width or diameter, already confines excitons in two lateral dimensions (i.e., a first and a second dimension), such exciton confinement in the axial direction (i.e., third dimension) effectively makes the aforementioned first segment the quantum dot. As such, the exemplary nanowire with the three segments comprises a quantum dot.

Axial confinement of excitons along a nanowire may be affected in a variety of ways. For example, the first segment described above may act as a quantum well to confine the excitons. In particular, the first segment may comprise a first semiconductor material having a first bandgap while the second and third segments may comprise a second semiconductor material having a second bandgap. If the first bandgap is smaller (i.e., narrower) than the second bandgap, the first segment will act as a quantum well and confine, at least partially, excitons within the nanowire. In such a case, the quantum well is a quantum dot since it is a segment of the nanowire and 3D confinement is achieved. In some embodiments, a length of such a segment that forms a quantum dot within the nanowire may be approximately equal to a diameter of the nanowire. For example, the length may be anywhere from a tenth of the diameter to about two or three times the diameter.

In various embodiments, the length of the segment may provide an extra degree of freedom facilitating tuning of a spectral property (e.g., emission frequency) of the nanowire LED. For example, the length may be chosen to control a carrier confinement energy. The carrier confinement energy is related to the emission frequency.

A surface plasmon is defined herein as a surface wave or plasma oscillation of a two dimensional free electron gas (2DEG) at a surface of a plasmon supporting material. The surface plasmon may also be considered as a quasiparticle representing a quantization of a plasma oscillation in a manner analogous to the representation of an electromagnetic oscillation quantization as a photon. For example, collective oscillations of 2DEG in a surface of a noble metal induced by an incident electromagnetic wave at optical frequencies may be represented in terms of surface plasmons. Furthermore, characteristics of an interaction between the surface plasmons and the surface may be characterized in terms of plasmonic modes. In particular, plasmonic modes represent characteristics of surface plasmons in much the same way that electromagnetic oscillations are represented in terms of electromagnetic or optical modes.

Surface plasmons and, by extension plasmonic modes, are confined to a surface of a material that supports surface plasmons. For example, an optical signal incident from a vacuum or a dielectric material on a surface of a surface plasmon supporting material may produce surface plasmons that propagate along the surface according to plasmonic modes. Surface plasmon supporting materials are materials such as, but not limited to, metals and certain organometallics that exhibit a dielectric constant having a negative value real part. Noble metals such as, but not limited to, gold (Au), silver (Ag) and copper (Cu) are materials that are known to support surface plasmons at or near to optical frequencies.

Figure 1B:
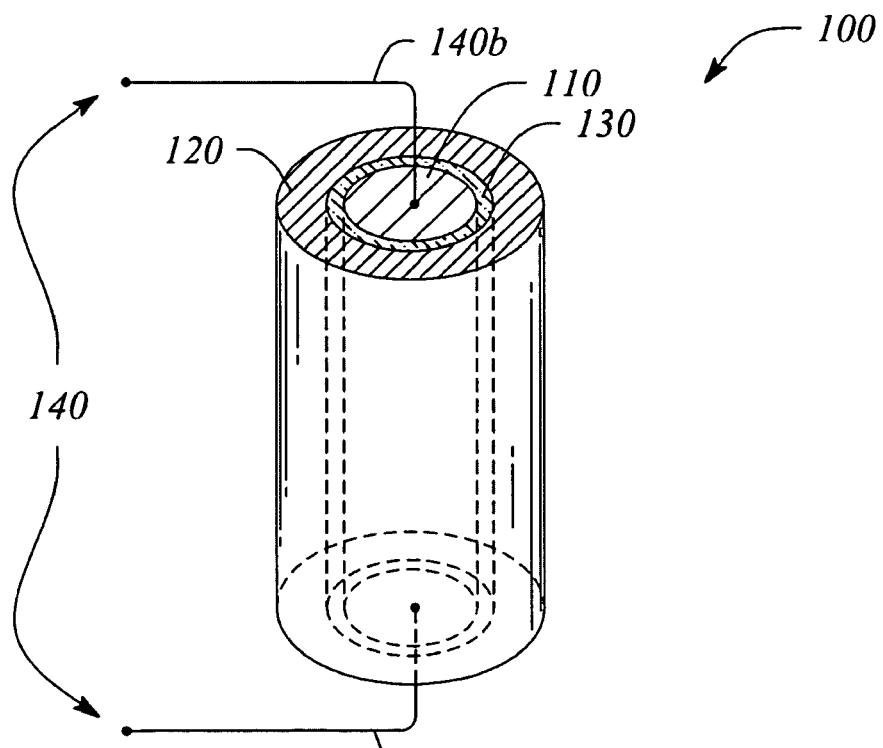
FIG. 1B illustrates a perspective view of a nanowire light emitting diode, according to an embodiment of the present invention.
Figure 2:
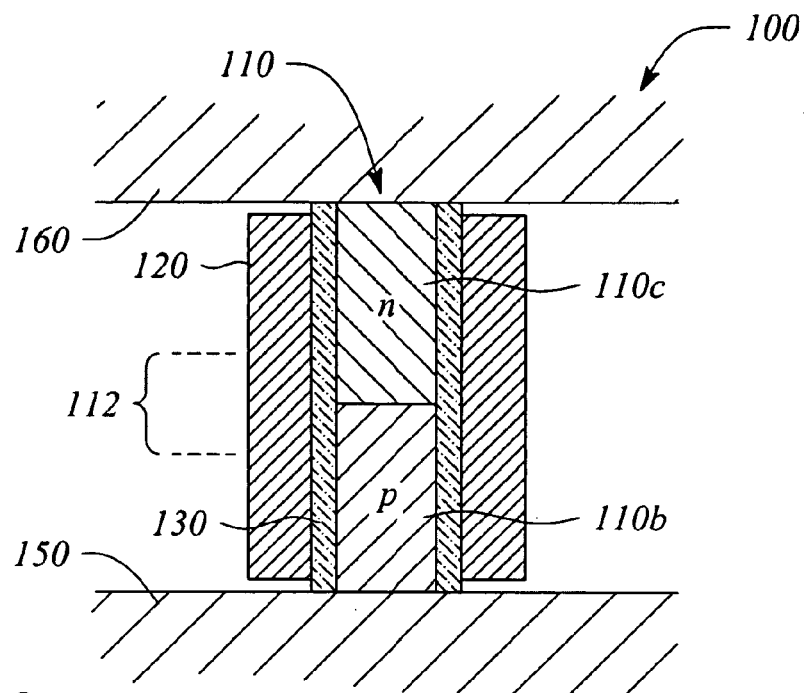
FIG. 2 illustrates a cross sectional view of a nanowire light emitting diode, according to another embodiment of the present invention.

For simplicity herein, no distinction is made between a substrate or slab and any layer or structure on the substrate/slab unless such a distinction is necessary for proper understanding. Likewise, all semiconductor junctions are referred to generically unless a distinction is necessary for proper understanding. Further, as used herein, the article 'a' is intended to have its ordinary meaning in the patent arts, namely 'one or more'. For example, 'a layer' generally means 'one or more layers' and as such, 'the layer' means 'the layer(s)' herein. Also, any reference herein to 'top', 'bottom', 'upper', 'lower', 'up', 'down', 'left' or 'right' is not intended to be a limitation herein. Moreover, examples herein are intended to be illustrative only and are presented for discussion purposes and not by way of limitation.

FIG. 1A illustrates a cross sectional view of a nanowire light emitting diode 100, according to an embodiment of the present invention. FIG. 1B illustrates a perspective view of a nanowire light emitting diode 100, according to another embodiment of the present invention. FIG. 2 illustrates a cross sectional view of a nanowire light emitting diode 100, according to another embodiment of the present invention.

The nanowire light emitting diode 100 comprises a nanowire 110. The nanowire 110 is a semiconductor nanowire and comprises a semiconductor junction 112. The semiconductor junction 112 produces light when a forward bias voltage is applied across the semiconductor junction 112. In particular, application of the forward bias voltage injects exciton pairs (e.g., holes and electrons) into an active region of the semiconductor junction 112. The injected excitons recombine within the active region to produce light. The recombination of the excitons occurs at a recombination rate.

In some embodiments, the semiconductor junction 112 comprises a p-i-n diode junction. In particular, as illustrated in FIG. 1A, a first region or a first axial segment 110a of the nanowire 110 comprises an essentially undoped or intrinsic semiconductor material (i-region). A second region (p-region) or a second axial segment 110b of the nanowire 110 comprises a semiconductor material doped with a p-type dopant. A third region (n-region) or a third axial segment 110c of the nanowire 110 comprises a semiconductor material doped with an n-type dopant. The first axial segment 110a is sandwiched between and separates the second axial segment 110b and the third axial segment 110c. Together, the first, second and third axial segments 110a, 110b, and 100c, form the p-i-n diode junction within and along an axial extent of the nanowire 110.

In other embodiments the semiconductor junction 112 comprises a p-n diode junction, as illustrated in the embodiment of FIG. 2. The p-n diode junction differs from the p-i-n diode junction in that only the second and third axial segments 110b, 110c comprising the p-region and the n-region, respectively, are present. The first axial segment 110a or i-region is omitted.

In some embodiments, the semiconductor junction 112 comprises a heterojunction. In general, the heterojunction may comprise a plurality of different semiconductor materials arranged in various combinations of layers or segments along an axial extent of the nanowire 110. For example, the heterojunction may comprise a first semiconductor material and a second semiconductor material wherein the first semiconductor material is a nanowire segment sandwiched between two nanowire segments of the second semiconductor material. In some embodiments, the exemplary first semiconductor material may have, or is characterized by, a bandgap that differs from (i.e., is either greater than or less than) a bandgap of the second semiconductor material.

Referring again to FIG. 1A, in some embodiments, the nanowire 110 may comprise a quantum dot 114. In particular, the nanowire 110 may comprise a segment along an axial extent or portion of the nanowire 110 that acts to confine excitons in an axial dimension. For example, the semiconductor junction 112 may comprise a heterojunction wherein a middle axial segment comprises a first semiconductor material having a bandgap that is relatively smaller than a bandgap of a second semiconductor material of adjoining segments of the nanowire that bound the middle segment on either end. The smaller bandgap of the middle axial segment will tend to trap and confine excitons within the middle segment thus creating the quantum dot 114.

In some embodiments where the semiconductor junction 112 is both a heterojunction and a p-i-n diode junction, the intrinsic region 110a may comprise the quantum dot 114. Referring again to FIG. 1A, the intrinsic region 110a may comprise the first semiconductor material having the first bandgap while the p-doped region 110b and the n-doped region 110c may comprise the second semiconductor material having the second bandgap. Furthermore, the first bandgap of the first material in the intrinsic region 110a may be less than or narrower than the second bandgap of the second semiconductor material in the p-doped and n-doped regions 110b, 110c, for example.

However, in general, a boundary between the first and second semiconductor materials of the heterojunction need not coincide with boundary ends of the intrinsic region 110a such that the entire intrinsic region 110a coincides with an extent of the first semiconductor material, for example. In particular, in some embodiments, only a portion of the intrinsic region 110c comprises the first semiconductor material. In other embodiments, the first semiconductor material may extend from the intrinsic region 110a into one or both of the p-region 110b and the n-region 110c. Thus, the quantum dot 114 may not always be exactly co-extensive with the intrinsic region 110a, for example.

In some embodiments, an axial extent or length of a portion the nanowire 110 that makes up the quantum dot 114 is approximately equal to a cross sectional width of the nanowire. By 'approximately equal' it is meant that the length of the quantum dot 114 is between about one half of the diameter and about two times the diameter. In other embodiments, the length of the quantum dot 114 is less than about one tenth the diameter of the nanowire 110. In yet other embodiments, the quantum dot 114 is greater than about two to three times the diameter of the nanowire 110.

The nanowire LED 100 further comprises a shell layer 120. The shell layer 120 is coaxially disposed around the nanowire (see FIG. 1B, for example). Further, the shell layer is adjacent to the semiconductor junction (see FIGS. 1A and 2, for example). In some embodiments, the shell layer 120 is essentially coextensive with a total length of the nanowire 110. In other embodiments, the shell layer 120 is shorter than the nanowire 110. For example, the shell layer 120 may be approximately coextensive with just the i-region 110a. In another example, the shell layer 120 may extend beyond the i-region and is adjacent to one or both of the p-region and n-region 110c. A specific length of the shell layer 120 may determine a phase of the plasmonic mode at an end of the shell layer 120. The phase, in turn, may affect an extent of enhancement provided by the plasmonic mode to the emitted light produced by the nanowire LED 100.

The shell layer 120 comprises a material that supports a surface plasmon. In particular, the shell layer 120 comprises a material that supports surface plasmons according to a plasmonic mode at an interface edge or surface of the material adjacent to the nanowire 110. In some embodiments, the shell layer 120 comprises a noble metal. Examples of noble metals that support a surface plasmon include, but are not limited to, gold (Au), silver (Ag), and copper (Cu). A selection of a particular plasmon supporting material depends, in part, on a wavelength of the light emitted by the nanowire LED 100. Typically, noble metals such as gold (Au), silver (Ag), and copper (Cu) support surface plasmons in a broad range of optical wavelengths and therefore, are good metals to use in the shell layer 120.

In some embodiments, the shell layer 120 comprises a relatively smooth, continuous layer of the surface plasmon supporting material. In general, a thickness of the plasmon supporting material is sufficient to support a plasmonic mode without appreciable loss. Typically, a thickness of greater than about 5 nanometers (nm) will achieve plasmonic mode support without appreciable loss. However, a minimum thickness may depend on a particular selection of the material and a quality (e.g., continuity and smoothness) of the shell layer 120. There is generally no maximum thickness of the shell layer 120.

The nanowire LED 100 further comprises a plasmonically thin insulating layer 130. The plasmonically thin insulating layer 130 is disposed between the shell layer 120 and the nanowire 110. The plasmonically thin insulating layer 130 electrically isolates the shell layer 120 from the nanowire 110. In particular, the plasmonically thin insulating layer 130 blocks conduction of electrons between the shell layer 130 and the nanowire 110. In addition, the plasmonically thin insulating layer 130 facilitates coupling of a surface plasmon of the shell layer 120 to an active region of the semiconductor junction 112. The coupling is provided by an evanescent field that is produced by the surface plasmon and that extends into the active region. To facilitate the coupling, the plasmonically thin insulating layer 130 is thin enough to allow penetration of the evanescent field into the active region. Thus, the term 'plasmonically thin' is defined herein to be thick enough to provide electrical isolation but thin enough to support plasmonic mode coupling.

The insulating layer 130 further facilitates optical coupling between the semiconductor junction 112 and the shell layer 120. In particular, the insulating layer 130 facilitates passage of an optical field generated in the semiconductor junction. The optical field that passes through the insulating layer 130 is coupled to the shell layer 120. The coupled optical field stimulates the surface plasmon of the shell layer 120. For example, the insulating layer 130 may be optically transmissive (e.g., optically transparent) at a wavelength of light emitted by the nanowire LED 100.

Generally, the plasmonically thin insulating layer 130 comprises a dielectric material disposed in a coaxial layer surrounding the nanowire 110. In some embodiments, the coaxial layer comprises a dielectric material formed as a continuous and essentially solid layer. In other embodiments, the coaxial layer is a porous layer having pores, holes or gaps that penetrate the dielectric material. The holes, pores or gaps may contain a vacuum or may be filled with air or another fluid, for example. However, even though the plasmonically thin insulating layer 130 may be porous, the plasmonically thin insulating layer 130 maintains the electrical isolation between the shell layer 120 and the nanowire 110.

The plasmonically thin insulating layer 130 may comprise essentially any dielectric material that provides insulation. For example, the plasmonically thin insulating layer 130 may comprise a thermal oxide of a semiconductor material of the nanowire 110. The thermal oxide of the plasmonically thin insulating layer 130 may be grown or otherwise formed/deposited on the nanowire 110 prior to forming the shell layer 120, for example. Alternatively, the plasmonically thin insulating layer 130 may comprise a carbide or a nitride of the nanowire 110 semiconductor material. Other exemplary dielectric materials that may be used include, but are not limited to, an oxide of a metal (e.g., aluminum oxide), an oxide of another material (e.g., silica glass) that is unrelated to the semiconductor material of the nanowire 110, and various polymer materials (e.g., polytetrafluoroethylene, polyimide, polystyrene).

As noted above, a thickness of the plasmonically thin insulator layer 130 is chosen to be thick enough to insure that electron conduction is blocked. However, the thickness is also chosen to be thin enough to facilitate coupling between the surface plasmons of the shell layer 120 and the active region of the nanowire 110. In some embodiments, the insulator layer 130 has a thickness that is greater than about 10 nm. In some embodiments, the insulator layer 130 has a thickness that is less than about 50 nm. In some embodiments, the insulator layer 130 has a thickness that is less than about 100 nm.

Referring to FIG. 1B, in some embodiments, the nanowire LED 100 further comprises electrodes 140. A first electrode 140a of the electrodes 140 is connected to a first end of the nanowire 110 and a second electrode 140b of the electrodes 140 connected to a second end of the nanowire 110. The electrodes 140 are electrically connected to the nanowire 110 and function to provide the forward bias voltage to the semiconductor junction 112. The electrodes 140 are electrically isolated from the shell layer 120.

In some embodiments, the nanowire LED 100 further comprises a substrate 150 (e.g., see FIGS. 1A and 2). The substrate 150 supports or carries the nanowire 110. For example, the substrate 150 may be connected to the nanowire 110 at the first end thereof. In some embodiments, the nanowire 110 is formed by in situ growth from the substrate 150 (e.g., by VLS growth). The substrate 150 is optically transparent at an optical frequency of the nanowire LED 100, in some embodiments. In other embodiments, the substrate 150 is optically opaque or even optically reflective. In some embodiments, the substrate 150 may comprise a semiconductor material. For example, the substrate 150 may be a semiconductor on insulator substrate. In other embodiments, the substrate may comprise or further comprise a metal or another conductive material. In some embodiments, the first electrode 140a (illustrated in FIG. 1B) is integrated in or otherwise provided by the substrate 150 illustrated in FIGS. 1A and 2.

In some embodiments, the nanowire LED 100 further comprises a cover layer 160 (e.g., see FIGS. 1A and 2). The cover layer 160 covers and is connected to the nanowire 110 at the second end thereof. In some embodiments, the cover layer 160 is optically transparent at an optical frequency of the nanowire LED 100. In some embodiments, the second electrode 140b (illustrated in FIG. 1B) is integrated in or otherwise provided by the cover layer 160 illustrated in FIGS. 1A and 2.

Figure 3:
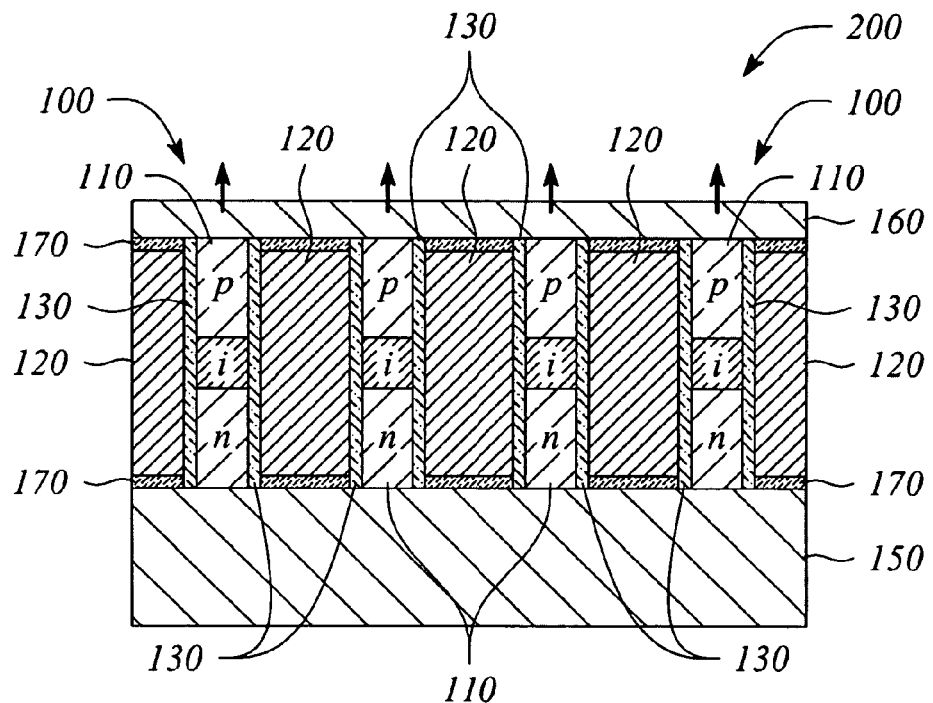
FIG. 3 illustrates a cross sectional view of an array of nanowire light emitting diodes, according to an embodiment of the present invention.

FIG. 3 illustrates a cross sectional view of an array 200 of nanowire light emitting diodes (LEDs) 100, according to an embodiment of the present invention. As illustrated in FIG. 3, a plurality of nanowire LEDs 100 is provided and arranged as the array 200. In some embodiments, the nanowire LEDs 100 may be parallel to one another and are disposed between the substrate 150 and the cover layer 160. The shell layer 120 essentially fills a space between individual nanowire LEDs 100, as illustrated in FIG. 3. As was described above, the nanowires 110 of the nanowire LEDs 100 are insulated from the shell layer 120 by the insulating layer 130. The array 200 may further comprise another insulator layer 170 between the shell layer 120 and one or both of the substrate 150 and the cover layer 160 in the space between the individual nanowire LEDs 100 to further insulate the shell layer 120 from the substrate 150 and the cover layer 160.

A combined light output of each of the nanowire LEDs 100 provides a light output of the array 200. For example, the substrate 150 may be a reflective substrate while the cover layer 160 may be optically transparent. The combined light output would be emitted from the second end of the respective nanowire LEDs 100 through the optically transparent cover layer 160 as indicated by the large, bold arrows in FIG. 3.

Figure 4:
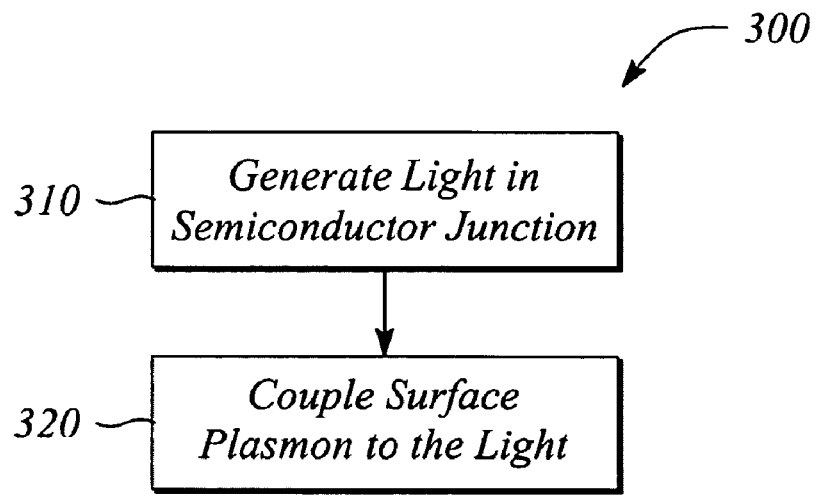
FIG. 4 illustrates a flow chart of a method of emitting light from a nanowire light emitting diode, according to an embodiment of the present invention.

FIG. 4 illustrates a flow chart of a method 300 of emitting light according to an embodiment of the present invention. The method 300 of emitting light comprises generating 310 light in a vicinity of a semiconductor junction of a nanowire. Generating 310 light may comprise applying a forward bias voltage across the semiconductor junction, for example. The applied forward bias injects excitons typically in the form of pairs of free holes and free electrons into semiconductor junction. The pairs of the injected excitons recombine in the semiconductor junction to produce photons that constitute the generated 310 light.

In some embodiments, the semiconductor junction comprises a p-i-n diode junction having an intrinsic region. In some such embodiments, the intrinsic region comprises a quantum dot. The quantum dot traps and concentrates the excitons to increase a probability of recombination. A bandgap difference between a semiconductor material within and a semiconductor material outside of the quantum dot may facilitate trapping of the excitons. As a result of trapping and concentrating the excitons, a recombination rate within the intrinsic region quantum dot may be enhanced.

The method 300 of emitting light further comprises coupling 320 a surface plasmon of a shell layer surrounding the nanowire to the generated 310 light. The surface plasmon is coupled 320 by an evanescent field of the surface plasmon extending from the shell layer into an active region of the semiconductor junction. In some embodiments, the evanescent field extends across a thin insulator layer that separates the shell layer from the nanowire. The surface plasmon may be further coupled 320 comprising the shell layer absorbing some of the generated photons, wherein the photons are part of the generated 310 light. The photons are absorbed by the shell layer after passing through the insulator layer, for example. In some embodiments, coupling 320 between the generated 310 light and the surface plasmon further enhances the recombination rate within the semiconductor junction.

Figure 5:
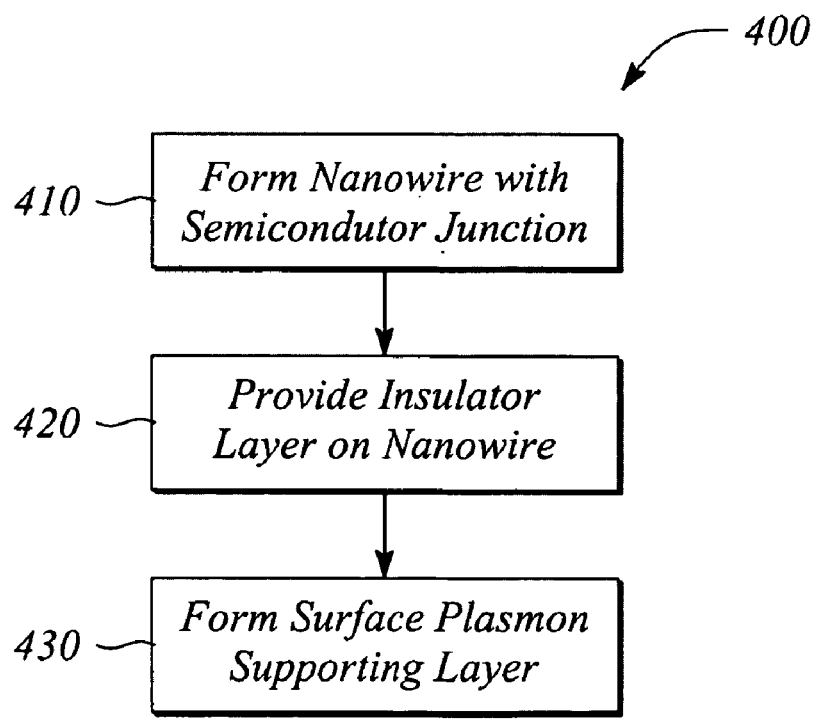
FIG. 5 illustrates a flow chart of a method of making a nanowire light emitting diode, according to an embodiment of the present invention.

FIG. 5 illustrates a flow chart of a method 400 of making a nanowire light emitting diode, according to an embodiment of the present invention. The method 400 of making a nanowire light emitting diode comprises forming 410 a nanowire having a semiconductor junction. The semiconductor junction is located axially along the nanowire between a first end and a second end of the nanowire. For example, the nanowire may be formed 410 by growing the nanowire from a substrate using the VLS technique. The semiconductor junction may be created during the growth by adjusting a composition (e.g., dopant type and concentration and/or semiconductor species) of a growth medium used in the VLS technique, for example. In particular, at different points during the growth of the nanowire, different dopant materials may be introduced to affect a particular type of doping (e.g., n-type or p-type) within a portion of the nanowire that is actively growing. Similarly, a semiconductor material of the nanowire may be changed during growth to introduce a quantum dot, for example.

Figure 6A:
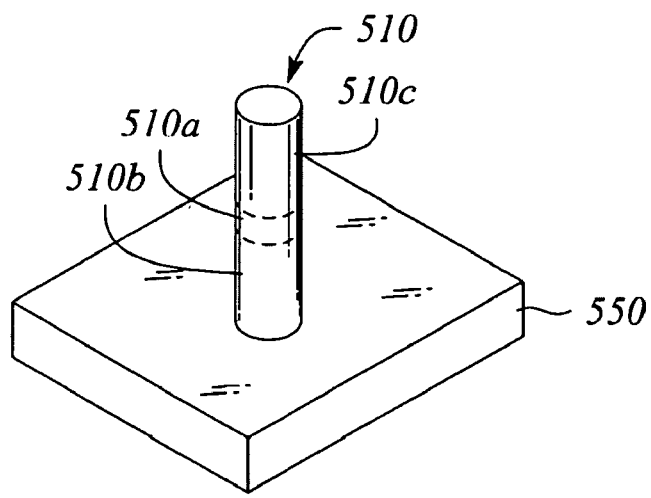
FIG. 6A illustrates a perspective view of an exemplary formed nanowire having a p-i-n diode junction, according to an embodiment of the present invention.
Figure 6B:
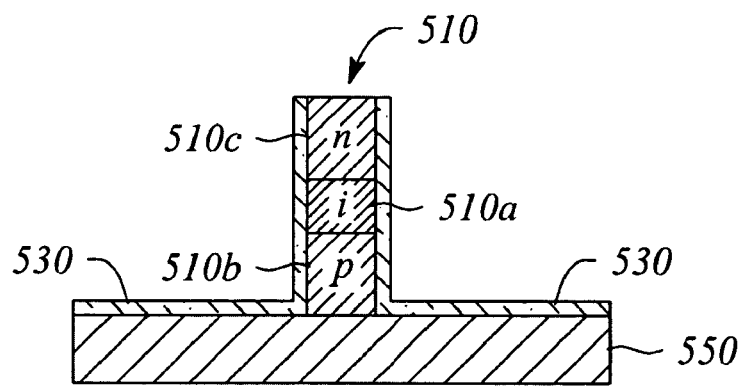
FIG. 6B illustrates a cross sectional view of the exemplary nanowire of FIG. 6A after providing an insulating layer on a surface of the nanowire, according to an embodiment of the present invention.

FIG. 6A illustrates a perspective view of an exemplary formed 410 nanowire 510 having a semiconductor junction, according to an embodiment of the present invention. FIG. 6B illustrates a cross sectional view of the exemplary nanowire 510 of FIG. 6A, according to another embodiment of the present invention. The semiconductor junction of the formed 410 nanowire 510 is illustrated as a p-i-n diode junction in FIG. 6B, by way of example. The illustrated nanowire 510 is formed 410 comprising two separate types of semiconductor materials with a p-type dopant and an n-type dopant introduced during nanowire growth. As such, the illustrated nanowire 510 possesses an i-region 510a, a p-region 510b, and an n-region 510c. Moreover, the i-region comprises a first semiconductor material having a first bandgap while the p-region and the n-region comprise a second semiconductor material having a second bandgap, as illustrated. The exemplary nanowire 510 is formed 410 on a substrate 550.

In some embodiments (not illustrated), a mask layer of an oxide or another mask material is formed on the substrate prior to forming 410 the nanowire. A hole is defined in the mask layer such that the hole exposes a surface of the substrate. The nanowire is then formed 410 on the exposed substrate surface. For example, a plurality of nanowires may be formed 410 on the exposed substrate surface through a similar plurality of holes comprising growing the nanowires in the holes using one or both of the VLS or VS techniques. The holes in the mask layer may facilitate positioning the formed 410 nanowires relative to one another on the substrate as a regular array of nanowires, for example.

Referring again to FIG. 5, the method 400 of making a nanowire light emitting diode further comprises providing 420 an insulator layer on a surface of the nanowire. The provided 420 insulator layer circumferentially covers the nanowire surface in a vicinity of the semiconductor junction. In some embodiments, the insulator layer may further cover a complete length of the nanowire.

Providing 420 the insulator layer may comprise growing an oxide such as, but not limited to a thermal oxide, on the surface of the nanowire. In some embodiments, the thermal oxide may also be grown on a surface of the substrate. In other embodiments, providing 420 may employ other methods such as, but not limited to, sputter deposition and chemical vapor deposition (CVD) to deposit the insulator layer either instead of or in addition to growing an oxide. In some embodiments, the insulator layer is provided 420 as an essentially solid layer while in other embodiments, the provided 420 insulator layer may be porous. In some embodiments, the insulating layer 530 is the same as the plasmonically thin insulating layer 130, as described above.

The method 400 of making a nanowire light emitting diode further comprises forming 430 a surface plasmon supporting layer adjacent to a surface of the insulator layer. In some embodiments, forming 430 a surface plasmon supporting layer comprises depositing a metal on the surface of the insulator layer. For example, a noble metal such as, but not limited to, gold (Au), silver (Ag), or copper (Cu), may be deposited on the surface of the insulating layer. The noble metal may be deposited by sputtering or evaporative deposition, for example. Other material suitable for forming the surface plasmon supporting layer may be similarly deposited or reactively created on the surface of the insulator layer in other examples. After forming 430, the surface plasmon supporting layer is electrically isolated from the nanowire by the insulator layer. In some embodiments, etching or mechanical polishing may be employed during forming 430 to insure that the surface plasmon supporting layer is electrically isolated from the nanowire by the insulator layer.

Referring back to FIG. 6B, FIG. 6B further illustrates the exemplary nanowire 510 of FIG. 6A after providing 420 an insulating layer 530 on a nanowire surface, according to an embodiment of the present invention. In particular, FIG. 6B illustrates a thin thermal oxide having been provided 420 as the insulating layer 530 over both the nanowire surface and a surface of the substrate 550. The thin thermal oxide is thick enough to serve as an insulator to block flow of an electric current (i.e., block exciton flow) but thin enough to facilitate evanescent coupling between a surface plasmon in the shell layer and recombining excitons in the active region of the semiconductor junction of the nanowire. For example, the thin thermal oxide illustrated in FIG. 6B may be between about 10 nm and 50 nm in some embodiments.

Figure 6C:
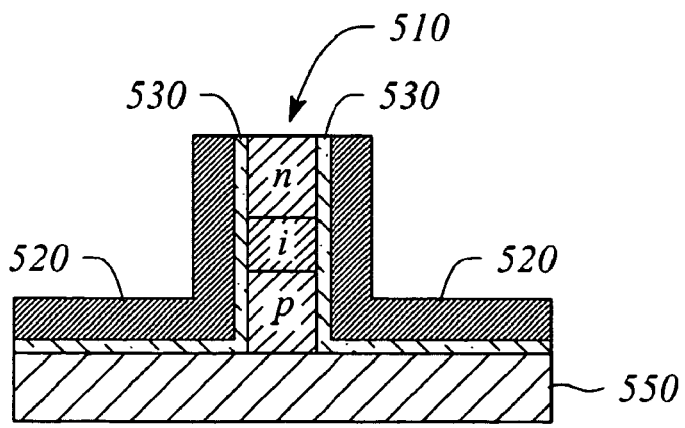
FIG. 6C illustrates a cross sectional view of the exemplary nanowire of FIG. 6B after forming a surface plasmon supporting layer adjacent to a surface of the insulator layer, according to an embodiment of the present invention.

FIG. 6C illustrates a cross sectional view of the exemplary nanowire of FIG. 6B after forming 430 the surface plasmon supporting layer adjacent to the surface of the insulator layer 530, according to an embodiment of the present invention. For example, the surface plasmon supporting layer 520 may comprise a metal that is formed 430 by depositing the metal on the previously provided insulating layer 530. After depositing, surface plasmon supporting layer 520 is polished or etched away from an end of the nanowire 510 to produce the configuration illustrated in FIG. 6C. In some embodiments, the surface plasmon supporting layer 520 is the same as the surface plasmon supporting layer 120 described above.

In some embodiments, the method 400 of making a nanowire light emitting diode further comprises providing a first electrode connected to the first end of the nanowire and providing a second electrode connected to the second end of the nanowire. The first and second electrodes are electrically isolated from the surface plasmon supporting layer. A forward bias voltage provided through the first and second electrodes supplies excitons that recombine as pairs in a vicinity of the semiconductor junction to generate the light that is emitted by the nanowire light emitting diode, as discussed above. The first electrode may be provided by or integrated with the substrate, for example. The second electrode may be provided as part of a cover layer that covers the second end of the nanowire, for example.

Thus, there have been described embodiments of an nanowire light emitting diode, a method of emitting light from a nanowire light emitting diode, and a method of making a nanowire light emitting diode that employ a surface plasmon having a plasmonic mode. It should be understood that the above-described embodiments are merely illustrative of some of the many specific embodiments that represent the principles of the present invention. Clearly, those skilled in the art can readily devise numerous other arrangements without departing from the scope of the present invention as defined by the following claims.

What is claimed is:

1. A nanowire light emitting diode comprising:
   a nanowire comprising a semiconductor junction;
   a shell layer that supports a surface plasmon, the shell layer being coaxially disposed around the nanowire adjacent to the semiconductor junction; and
   a plasmonically thin insulating layer disposed between the shell layer and the nanowire, the plasmonically thin insulating layer both electrically isolating the shell layer from the nanowire and permitting evanescent field coupling between the surface plasmon and an active region of the semiconductor junction,
   wherein one or both of a light emission efficiency and a rate of light emission of the light emitting diode are enhanced.

2. The nanowire light emitting diode of claim 1, wherein the semiconductor junction comprises a p-i-n diode junction and a quantum dot, wherein a forward bias voltage applied across the p-i-n diode junction produces light that couples to and is enhanced by the surface plasmon.

3. The nanowire light emitting diode of claim 1, wherein the semiconductor junction is a heterojunction comprising a first semiconductor material having a first bandgap and second semiconductor material having a second bandgap, the first bandgap being less than the second bandgap, the rate of light emission being further enhanced by a difference between the first bandgap and the second bandgap, the difference preferentially confining excitons in the first semiconductor material.

4. The nanowire light emitting diode of claim 3, wherein the heterojunction is a p-i-n diode junction having an intrinsic region comprising the first semiconductor material sandwiched between and separating a p-doped region and an n-doped region, the p-doped region and n-doped region comprising the second semiconductor material.

5. The nanowire light emitting diode of claim 4, wherein the intrinsic region has an axial length that is approximately equal to a cross sectional width of the nanowire.

6. The nanowire light emitting diode of claim 1, wherein the shell layer comprises a noble metal.

7. The nanowire light emitting diode of claim 1, wherein the shell layer is essentially coextensive with a majority of length of the nanowire.

8. The nanowire light emitting diode of claim 1, wherein the plasmonically thin insulator layer has a thickness of between about 10 nanometers and about 50 nanometers.

9. The nanowire light emitting diode of claim 1, further comprising a first electrode connected to a first end of the nanowire and a second electrode connected to a second end of the nanowire, the first and second electrodes being electrically isolated from the shell layer, wherein a forward bias voltage applied across the semiconductor junction of the nanowire using the first electrode and the second electrode produces light within the active region that couples to and is enhanced by the surface plasmon of the shell layer.

10. The nanowire light emitting diode of claim 1, further comprising:
    substrate that connects to and supports a first end of the nanowire; and
    a cover layer that connects to a second end of the nanowire,
    wherein one or both of the substrate and the cover layer are optically transmissive at an optical frequency of the nanowire light emitting diode.

11. The nanowire light emitting diode of claim 1, wherein the nanowire light emitting diode is used in an array comprising a plurality of the nanowire light emitting diodes, a combined light output of each of the nanowire light emitting diodes providing a light output of the array, and wherein adjacent nanowire light emitting diodes share a common shell layer between separate nanowires.

12. A method of emitting light, the method comprising:
    generating light in a vicinity of a semiconductor junction of a nanowire;
    coupling a surface plasmon to the semiconductor junction during generating light, the surface plasmon being from a shell layer coaxially surrounding the nanowire adjacent to the semiconductor junction, the surface plasmon being coupled through an insulating layer separating the nanowire and the shell layer, the insulating layer being plasmonically thin and both electrically isolating the shell layer from the nanowire and permitting evanescent field coupling between the surface plasmon and an active region of the semiconductor junction, wherein one or both of a light emission efficiency and a rate of light emission are enhanced.

13. The method of emitting light of claim 12, wherein coupling a surface plasmon comprises:
    absorbing some energy from photons of the generated light with an electron gas of the shell layer; and
    extending an evanescent field of the surface plasmon through the insulating layer between the shell layer and the nanowire, the evanescent field interacting with recombining excitons in an active region of the semiconductor junction.

14. The method of emitting light of claim 12, wherein the semiconductor junction comprises a p-i-n diode junction having an intrinsic region that comprises a quantum dot, and wherein generating light comprises generating photons by exciton recombination within the quantum dot.

15. The method of emitting light of claim 12, wherein coupling a surface plasmon further enhances the light emission rate by enhancing an exciton recombination rate in a quantum dot of the semiconductor junction.

16. The method of emitting light of claim 12, further comprising trapping excitons in a quantum well of the nanowire, the quantum well comprising a heterojunction formed from a first semiconductor material of the nanowire having a first bandgap and a second semiconductor material of the nanowire having a second bandgap, the second semiconductor material being sandwiched between two portions of the first semiconductor material, the second bandgap being less than the first band gap, wherein the trapped excitons recombine to facilitate the light emission.

17. A method making a nanowire light emitting diode, the method comprising:
 forming a nanowire having a semiconductor junction between a first end and a second end of the nanowire;
 providing an insulator layer on a surface of the nanowire, the insulator layer circumferentially covering the nanowire surface in a vicinity of the semiconductor junction, the insulator layer being plasmonically thin; and
 forming a shell layer coaxially disposed around the nanowire and adjacent to a surface of the insulator layer in the vicinity of the semiconductor junction, the shell layer supporting a surface plasmon,
 wherein the insulator layer electrically isolates the nanowire from the shell layer while allowing passage of an evanescent field that couples the surface plasmon on the shell layer to an active region of the semiconductor junction, and wherein one or both of a light emission efficiency and a rate of light emission of the light emitting diode are enhanced.

18. The method of making a nanowire light emitting diode of claim 17, wherein the semiconductor junction comprises a p-i-n diode junction and a quantum dot, wherein a forward bias voltage applied across the p-i-n diode junction produces light that couples to and is enhanced by the surface plasmon.

19. The method of making a nanowire light emitting diode of claim 17, further comprising providing a first electrode connected to the first end of the nanowire and providing a second electrode connected to the second end of the nanowire, the first and second electrodes being electrically isolated from the shell layer, wherein a forward bias voltage provided through the first and second electrodes supplies excitons that recombine as pairs in a vicinity of the semiconductor junction to generate the light that is emitted by the nanowire light emitting diode, and wherein some the generated light is absorbed by the shell layer to form the surface plasmon, the surface plasmon enhances one or both of a light emission efficiency and a rate of light emission of the generated light.

20. The method of making a nanowire light emitting diode of claim 17, wherein providing an insulator layer comprises forming an oxide on a surface of the nanowire, the oxide having a thickness of between about 10 nanometers and about 50 nanometers and, wherein forming a shell layer comprises applying a metal layer, the metal layer comprising a noble metal.

\* \* \* \* \*

UNITED STATES PATENT AND TRADEMARK OFFICE
CERTIFICATE OF CORRECTION

| | | |
|---|---|---|
| PATENT NO. | : 8,129,710 B2 | Page 1 of 1 |
| APPLICATION NO. | : 12/262451 | |
| DATED | : March 6, 2012 | |
| INVENTOR(S) | : Hans Cho et al. | |

It is certified that error appears in the above-identified patent and that said Letters Patent is hereby corrected as shown below:

In column 18, line 22, in Claim 19, delete "some" and insert -- some of --, therefor.

Signed and Sealed this
Sixth Day of November, 2012

David J. Kappos
*Director of the United States Patent and Trademark Office*